US012677659B2

(12) United States Patent
Hou et al.

(10) Patent No.: US 12,677,659 B2
(45) Date of Patent: Jul. 7, 2026

(54) SUBSTRATES FOR POWER STAGE ASSEMBLIES COMPRISING BOTTOM-COOLED SEMICONDUCTOR POWER SWITCHING DEVICES

(71) Applicant: GaN Systems Inc., Kanata (CA)

(72) Inventors: Ruoyu Hou, Kanata (CA); Juncheng Lu, Kanata (CA); Andrew Dickson, Woodlawn (CA)

(73) Assignee: GAN SYSTEMS INC., Ottawa (CA)

( * ) Notice: Subject to any disclaimer, the term of this patent is extended or adjusted under 35 U.S.C. 154(b) by 753 days.

(21) Appl. No.: 17/979,970

(22) Filed: Nov. 3, 2022

(65) Prior Publication Data

US 2023/0282540 A1     Sep. 7, 2023

Related U.S. Application Data

(60) Provisional application No. 63/316,122, filed on Mar. 3, 2022.

(51) Int. Cl.
H10W 90/00 (2026.01)
H10D 62/85 (2025.01)
(Continued)

(52) U.S. Cl.
CPC ...... H10W 40/226 (2026.01); H10D 62/8503 (2025.01); H10W 40/255 (2026.01); H10W 40/259 (2026.01); H10W 90/00 (2026.01)

(58) Field of Classification Search
CPC ............. H01L 23/3672; H01L 23/3731; H01L 23/3735; H01L 23/49822; H01L 23/36;
(Continued)

(56) References Cited

U.S. PATENT DOCUMENTS 9,589,868 B2    3/2017  Macknight-Macneil et al.
9,589,869 B2    3/2017  Macknight-Macneil et al.
(Continued)

OTHER PUBLICATIONS

Hou, Ruoyu (Roy); GaN Systems Inc., "Thermal Management Tips for GaN Transistors", Jul. 14, 2020 (www.gansystems.com); pp. 1-39.

(Continued)

*Primary Examiner* — Omar F Mojaddedi
(74) *Attorney, Agent, or Firm* — WORKMAN NYDEGGER

(57) ABSTRACT

A multi-zone substrate for a power stage assembly comprising at least one bottom-cooled semiconductor power switching device and driver components, for integration on a common substrate. A first zone provides electrical connections and a thermal pad for mounting at least one bottom-cooled semiconductor switching device, the first zone comprising dielectric and conductive layers which provide a power substrate optimized for thermal performance. A second zone provides electrical connections for mounting driver components, the second zone comprising dielectric and conductive layers providing a driver substrate optimized for electrical performance. For example, the first zone comprises a single layer metal interconnect structure with a first thermal resistance, the second zone comprises a multi-layer metal interconnect structure with a second thermal resistance, the first thermal resistance being less than the second thermal resistance. The power stage assembly may comprise a multi-zone substrate configured for a single switch, half-bridge or full-bridge switch topology.

37 Claims, 14 Drawing Sheets

Example: power stage assembly with multi-zone substrate and dual-side cooling

(51) Int. Cl.

| | |
|---|---|
| *H10W 40/22* | (2026.01) |
| *H10W 40/25* | (2026.01) |
| *H10W 70/60* | (2026.01) |
| *H10W 72/00* | (2026.01) |

(58) Field of Classification Search
CPC ..... H01L 23/3677; H01L 23/14; H01L 23/13; H01L 23/142; H01L 23/15; H01L 23/367; H01L 23/48; H01L 23/498; H01L 25/072; H01L 25/18; H01L 25/07; H01L 25/16; H02M 7/003; H10D 62/8503; H10W 40/226; H10W 40/255; H10W 40/259; H10W 40/10; H10W 40/228; H10W 40/22; H10W 70/685; H10W 70/69; H10W 70/60; H10W 70/68; H10W 70/6875; H10W 70/692; H10W 72/00; H10W 90/00
See application file for complete search history.

(56) References Cited

U.S. PATENT DOCUMENTS

| | | | |
|---|---|---|---|
| 9,659,854 | B2 | 5/2017 | Klowak et al. |
| 9,824,949 | B2 | 11/2017 | Macknight-Macneil et al. |
| 11,139,373 | B2 | 10/2021 | Mizan et al. |
| 11,183,440 | B2 | 11/2021 | Lu et al. |
| 2005/0167849 | A1* | 8/2005 | Sato .................... H01L 23/3121 |
| | | | 257/E23.125 |
| 2016/0240471 | A1 | 8/2016 | Klowak et al. |
| 2016/0268185 | A1 | 9/2016 | Macknight-Macneil et al. |
| 2016/0268190 | A1 | 9/2016 | Macknight-Macneil et al. |
| 2016/0307826 | A1 | 10/2016 | Macknight-Macneil et al. |
| 2019/0237416 | A1* | 8/2019 | Gao .................. H02M 3/33592 |
| 2020/0185302 | A1 | 6/2020 | Lu et al. |
| 2021/0127490 | A1* | 4/2021 | Palm ...................... H05K 1/181 |
| 2022/0020669 | A1 | 1/2022 | Macknight-Macneil et al. |
| 2022/0139809 | A1 | 5/2022 | Mousavian et al. |
| 2022/0278021 | A1* | 9/2022 | Nootens ................ H01L 23/053 |
| 2022/0361315 | A1* | 11/2022 | Zhou ...................... H05K 1/181 |

OTHER PUBLICATIONS

GaN Systems Inc.; "High Power IMS Evaluation Platform—Users Guide" v. Dec. 19, 2017; GSP65RxxHB-EVB 650V; (www.gansystems.com); pp. 1-38.

GaN Systems Inc.; "GaN Systems Releases New High Power Insulated Metal Substrate (IMS) Evaluation Platform"; Press Release; Dec. 14, 2017; 2 pages.

Hunter, G.; "IMS (Insulated Metal Substrate) PCBs"; PCB Design; Nov. 4, 2014; 5 pages.

ON Semiconductor; Technical Note TND6031/D; "Introducing Intelligent Power Module (IPM) Family from ON Semiconductor"; Apr. 2014 Rev. 3 (http:/onsemi.com); 8 pages.

* cited by examiner

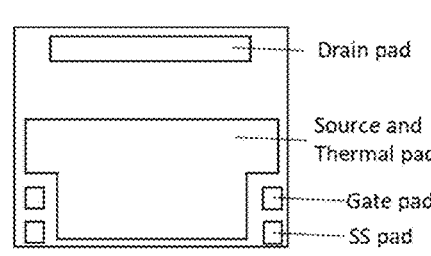
Example:  650V GaN E-mode power transistor in GaN*Px*® "B-Type"
embedded die package with bottom-side thermal pad
Fig. 1 (Prior Art)
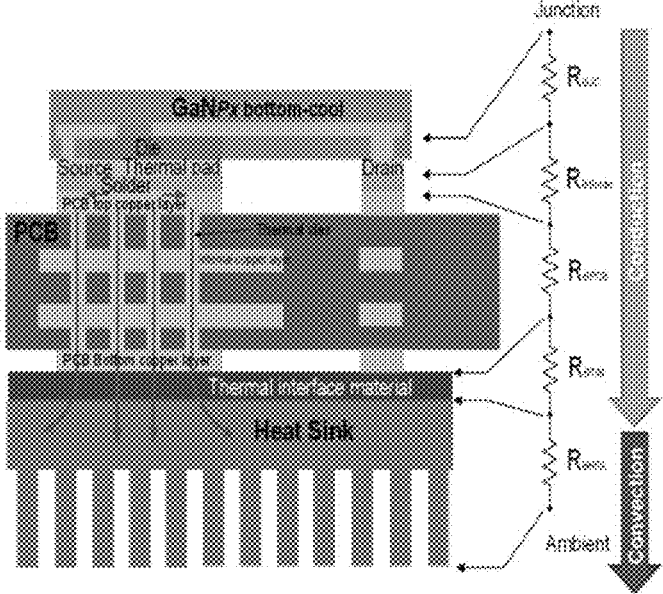
Example: Elements of thermal resistance in thermal path for bottom-cooled
power stage assembly using FR4 PCB with thermal vias and thermal interface
material
Fig. 2 (Prior Art)

Conductive layer

Dielectric layer

Metal substrate

Power semiconductor device

IMS board

Thermal grease

Heat sink

Example: Bottom-cooled Insulated Metal Substrate (IMS) power stage assembly

Gate driver board

GaN power switching devices

IMS Board

Heatsink

IMS Board

Heatsink

Gate driver board

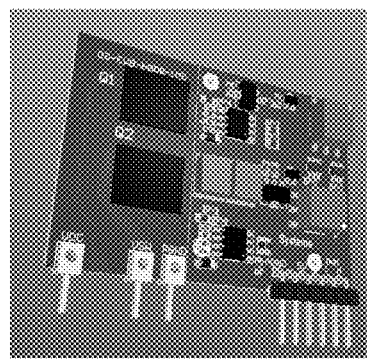

Fig. 6

Power
semiconductor
switching devices

Gate driver
chips

Decoupling
capacitors

Multi-metal
IMS

Single-metal
IMS

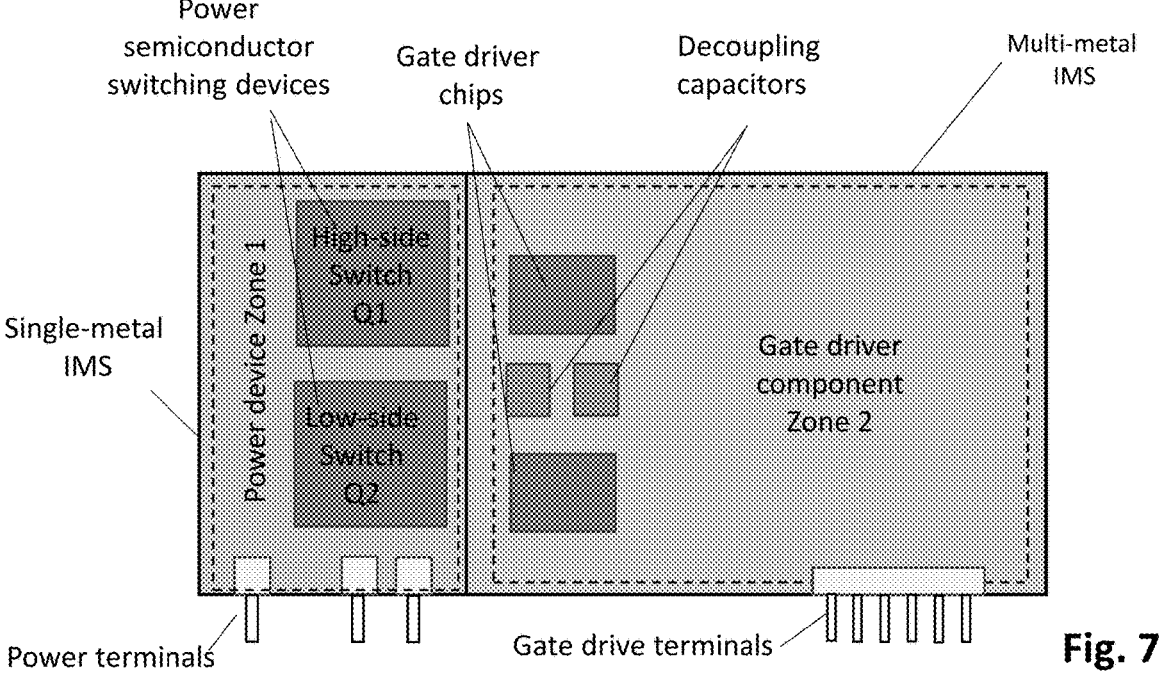

Power device Zone 1

High-side
Switch
Q1

Low-side
Switch
Q2

Gate driver
component
Zone 2

Power terminals

Gate drive terminals

Fig. 7

Power switching
device

Gate driver
components

Single-
metal
IMS

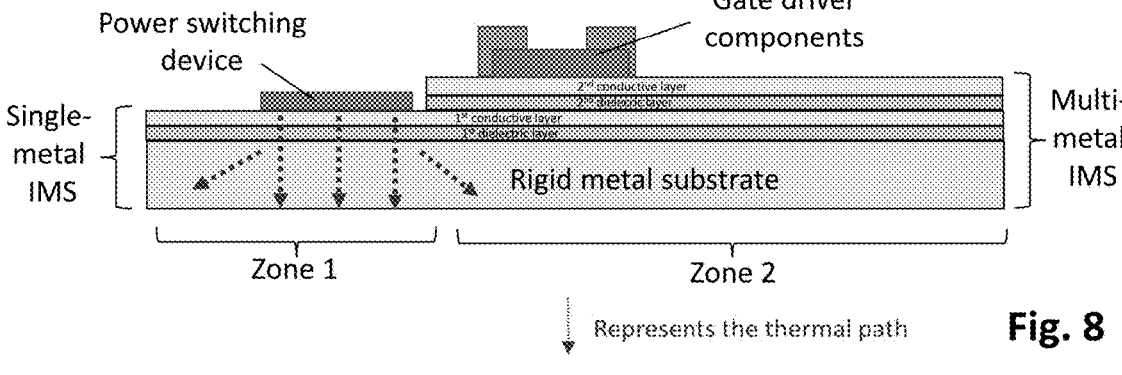

2ⁿᵈ conductive layer
2ⁿᵈ dielectric layer
1ˢᵗ conductive layer
1ˢᵗ dielectric layer Rigid metal substrate Multi-
metal
IMS Zone 1

Zone 2

Represents the thermal path

Fig. 8

Zone 1
Single-metal IMS

Zone 2
Multi-metal IMS

GaN*Px* packaged
GaN power switch
die

Gate drivers and driver
components

Top dielectric

Conductive metal 2

Dielectric 2

Conductive metal 1

Dielectric 1

Metal substrate

Bottom-side
drain pad

Bottom-side
thermal pad/
source pad

Thermal grease

Heatsink

Multi-zone substrate of 3rd example embodiment

Multi-zone substrate for GaN half-bridge and gate driver of
3rd example embodiment Multi-zone substrate of 4th example embodiment Multi-zone substrate
design example
top view Multi-zone substrate
design example
bottom view Underlying ceramic
inlay areas
Multi-zone substrate
design example
Interconnect layout
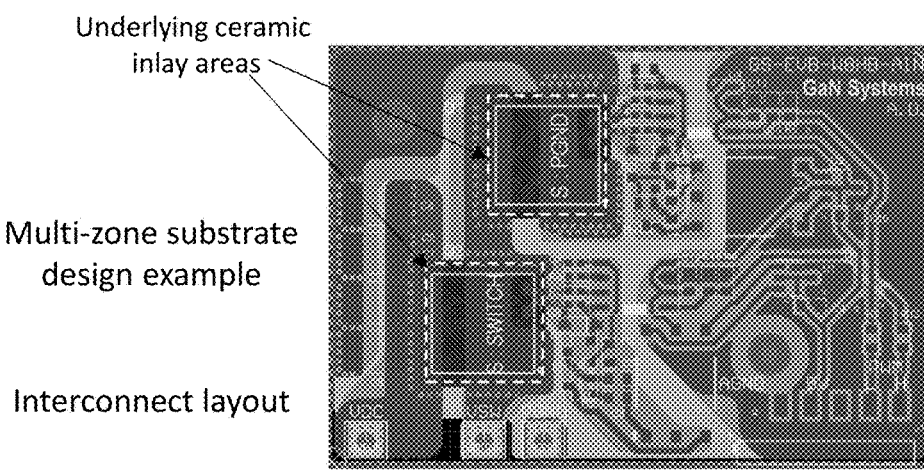
Fig. 17
PCB design
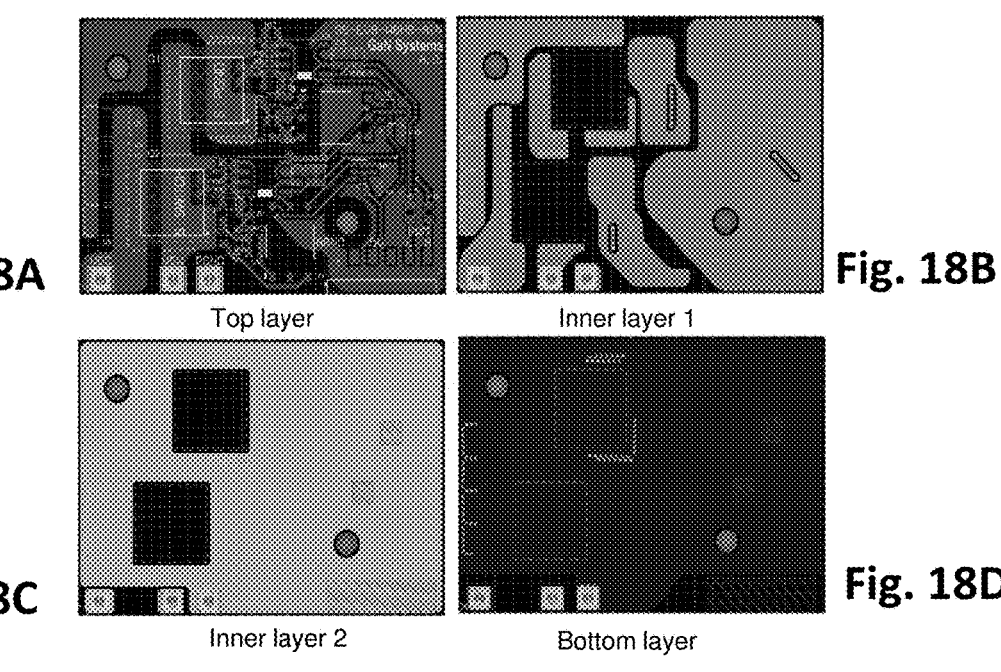
Fig. 18A
Top layer
Fig. 18B
Inner layer 1
Fig. 18C
Inner layer 2
Fig. 18D
Bottom layer
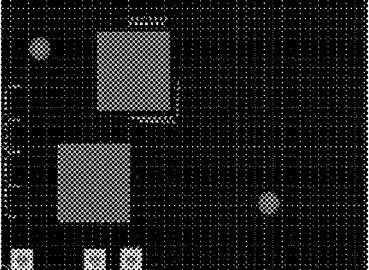
Ceramic inlay (zone 1)          Fig. 18E

GS-065-030-2-L based design thermal comparison
for multi-zone substrate

Multi-metal IMS type multi-zone substrate

Metal N
Dielectric N

Metal 3
Dielectric 3
Metal 2
Dielectric 2
Metal 1
Dielectric 1

Rigid metal substrate

Zone 2 optimized for
electrical performance

Zone 1 optimized for
thermal performance

Examples of DBC type multi-zone substrate with multi-metal layers

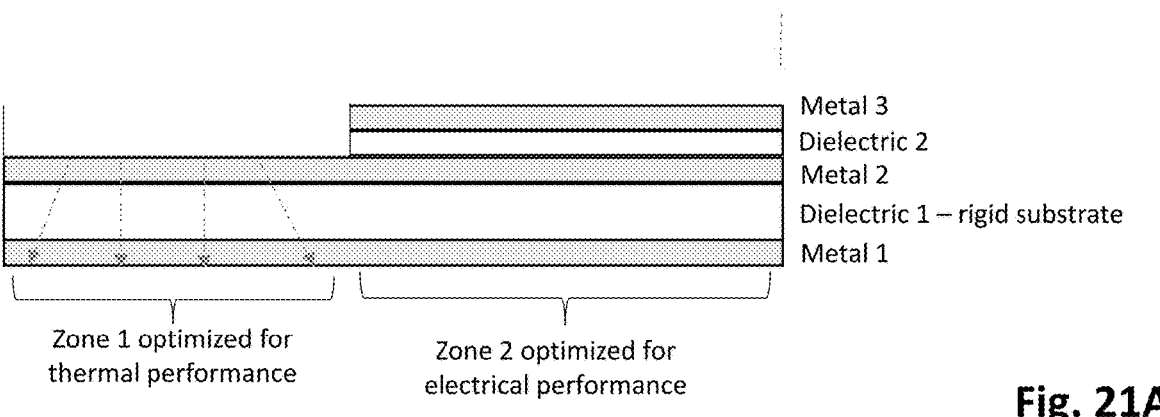

Metal 3
Dielectric 2
Metal 2
Dielectric 1 – rigid substrate
Metal 1

Zone 1 optimized for thermal performance

Zone 2 optimized for electrical performance

Fig. 21A

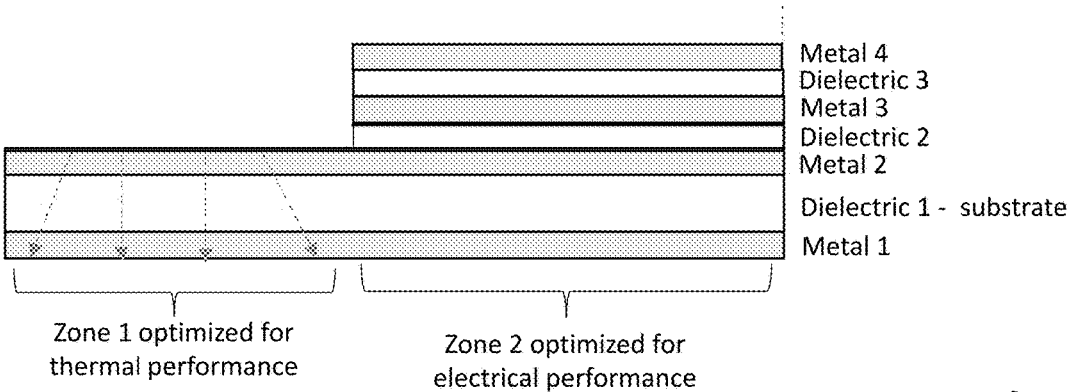

Metal 4
Dielectric 3
Metal 3
Dielectric 2
Metal 2
Dielectric 1 - substrate
Metal 1

Zone 1 optimized for thermal performance

Zone 2 optimized for electrical performance

Fig. 21B

Examples of multi-zone substrates with ceramic inlay for zone 1

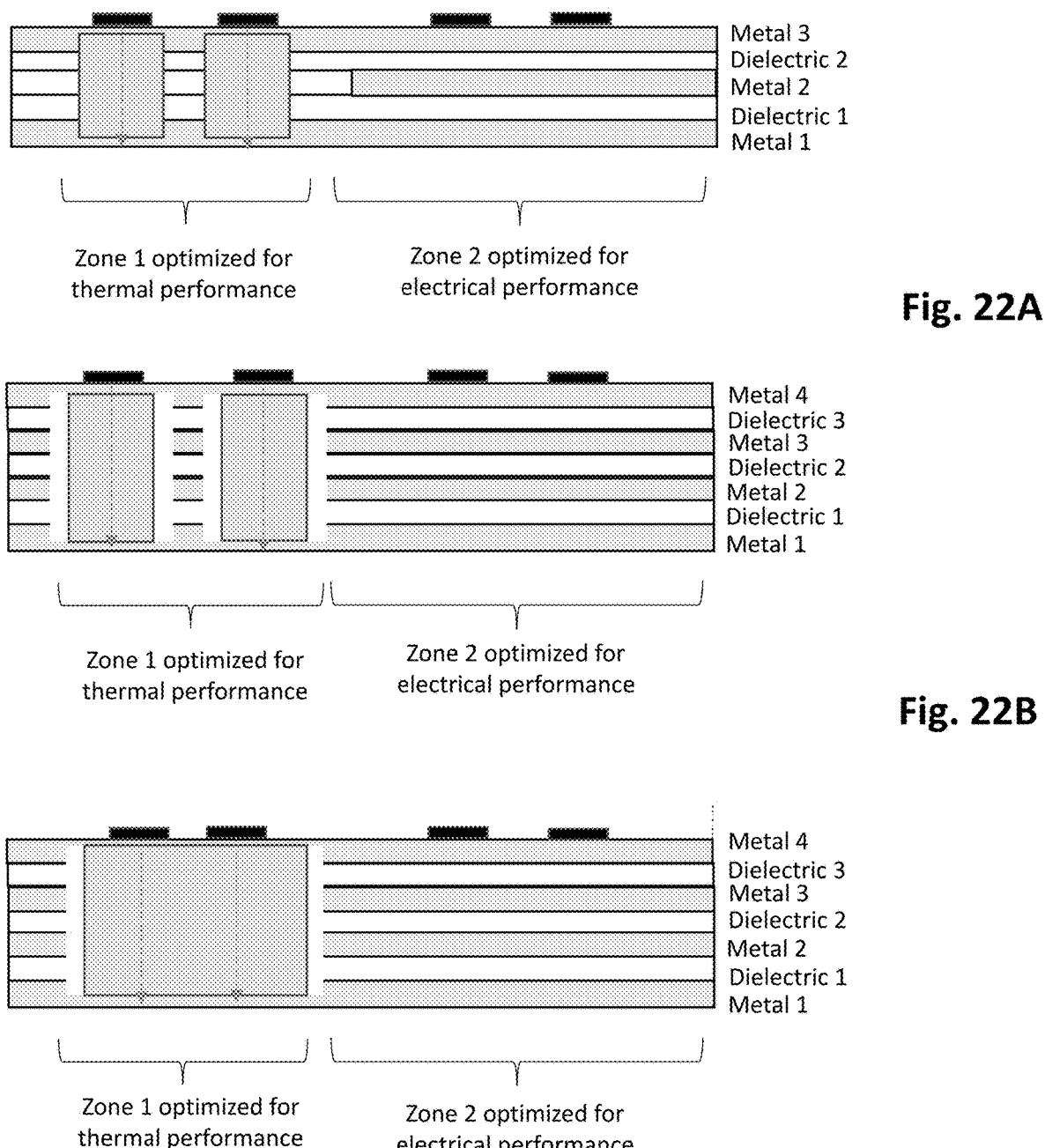

Metal 3
Dielectric 2
Metal 2
Dielectric 1
Metal 1

Zone 1 optimized for
thermal performance

Zone 2 optimized for
electrical performance

Fig. 22A

Metal 4
Dielectric 3
Metal 3
Dielectric 2
Metal 2
Dielectric 1
Metal 1

Zone 1 optimized for
thermal performance

Zone 2 optimized for
electrical performance

Fig. 22B

Metal 4
Dielectric 3
Metal 3
Dielectric 2
Metal 2
Dielectric 1
Metal 1

Zone 1 optimized for
thermal performance

Zone 2 optimized for
electrical performance

Fig. 22C

Example: power stage assembly with multi-zone substrate and dual-side cooling

SUBSTRATES FOR POWER STAGE ASSEMBLIES COMPRISING BOTTOM-COOLED SEMICONDUCTOR POWER SWITCHING DEVICES

CROSS-REFERENCE TO RELATED APPLICATION(S)

This application claims priority from U.S. provisional patent application no. 63/316,122, filed Mar. 3, 2022, which is incorporated herein by reference in its entirety.

TECHNICAL FIELD

This invention relates to substrates for power stage assemblies comprising bottom-cooled semiconductor power switching devices, for example, power stages comprising Gallium Nitride (GaN) power transistors for high current/high voltage applications, and substrates for integration of power switching components and driver components.

BACKGROUND

Power semiconductor switching devices may comprise lateral high electron mobility transistors (HEMTs), such as lateral enhancement-mode (E-mode) HEMTs fabricated with wide-bandgap semiconductor technologies, e.g. III-Nitride based semiconductor materials.

GaN power transistors, such as lateral GaN HEMTs, provide for high current, high voltage operation combined with high switching frequency. For some power applications, GaN power devices and systems offers advantages over silicon technology using Si IGBTs and diodes and silicon carbide (SiC) power transistors and diodes. For example, power switching systems comprising lateral GaN power transistors provide higher efficiency switching, with lower losses, and smaller form factor than comparable systems based on silicon or SiC technology. To benefit from the inherent performance characteristics of lateral GaN transistors, important design considerations include, e.g.: device layout (topology), low inductance interconnect and packaging, and effective thermal management. Lateral GaN power transistors for high current operation at 100V and 650V are currently available from GaN Systems Inc. based on Island Technology® that provides a large gate width $W_g$, low on-resistance, $R_{on}$, and high current capability per unit active area of the device.

Embedded die packaging solutions that offer low induc- tance interconnections, and low thermal impedance, using either top-side or bottom-side thermal pads, are disclosed, for example, in GaN Systems Inc. earlier filed patent docu- ments and non-patent publications relating to GaNPx® embedded die packaging.

GaN power switching devices offer high current capabil- ity, in compact surface mount device (SMD) packaging, such as GaNPx type embedded die packaging. To provide high current capability, power modules or power stage assemblies may comprise multiple GaN transistors mounted on a substrate providing electrical connections, e.g. a power substrate such as a printed circuit board (PCB) or power substrate of a power module on which multiple GaN tran- sistors are connected in parallel and configured to provide high-side and low-side switches of a half-bridge switching topology, or other switching topology. Power substrates may be based, for example, on multilayer PCB technology using FR4-type dielectric layers and copper conductive layers, IMS (Insulated Metal Substrate) technology, or DBC (Direct Bond Copper) technology, A presentation by Ruoyu Hou (Hou), entitled "Thermal Management Tips for GaN Transistors", dated 14 Jul. 2020, provides background information on thermal management design for GaN power switching devices comprising GaN transistors such as e-mode lateral GaN HEMTs using top-cool and bottom-cool designs. For example, because the drain-source on-resistance, $R_{DSon}$, and conduction losses are temperature dependent, and time-to-failure is accelerated at increased junction temperature Tj, good thermal design at both the device level and system level is an important consideration for performance improvement, e.g. reducing overall losses, improving system efficiency and/or improv- ing system reliability.

For example, high current GaN HEMTs having a smaller die size, and smaller embedded die package size, which provides higher power density, and a small area thermal pad, presents challenges for thermal management, particularly to remove heat efficiently from multiple power devices mounted in close proximity on a power substrate. A barrier to further improve thermal performance of bottom-cooled devices is limited area of the thermal pad area/size of the device. With smaller die sizes, and smaller packages, ther- mal performance is limited by the area of the thermal pad. On the other hand, in larger sized package, parasitics such as interconnect inductance or resistance, may limit perfor- mance of power semiconductor devices comprising GaN HEMTs, which are capable of fast switching speeds (fast turn-on and turn-off times, and operation at higher switching frequencies).

There is a need for improved or alternative thermal management solutions for semiconductor power switching devices, such as, power stages comprising GaN power transistors.

In currently available power stage assemblies, there are also challenges in integrating a power substrate, e.g. a printed circuit board or other type of substrate, supporting one or more semiconductor power switching devices, such as high-side and low-side switches of a half-bridge or full-bridge switch topology, and gate driver components, which are provided on a separate gate driver circuit board. Many solutions are known and have been proposed, and there may be a trade-off between optimizing one or more factors, such as thermal performance, electrical perfor- mance, manufacturability, layout flexibility, cost, et al., to meet requirements for a particular power switching appli- cation. There is a need for alternative or improved solutions to address one or more of these challenges.

SUMMARY OF INVENTION

The present invention seeks to provide improved or alternative substrates for power stage assemblies comprising semiconductor power switching devices, e.g. high current/high voltage GaN power transistors and driver circuitry, which mitigate or circumvent at least one of the above-mentioned problems and/or provide improvements to at least one of thermal performance, manufacturability, and layout flexibility.

A first aspect of the invention provides a substrate for a power stage assembly comprising at least one bottom-cooled semiconductor power switching device and driver compo- nents, comprising:

a first zone comprising electrical connections and a ther-
    mal pad for mounting the at least one bottom-cooled semiconductor switching device, the first zone comprising a layer structure optimized for thermal performance; and a second zone comprising electrical connections for mounting driver components, the second zone comprising a layer structure optimized for electrical performance.

For example, the first zone has a first thermal resistance between the thermal pad and a bottom surface of the substrate, and the second zone has a second thermal resistance between top and bottom surfaces of the substrate, wherein the first thermal resistance is significantly less than the second thermal resistance.

The first zone may comprise one or more electrically conductive layers and the second zone comprises at least one additional electrically conductive layer.

In a substrate of some embodiments, the first zone comprises a single electrically conductive layer and the second zone comprises a plurality of electrically conductive layers.

In some embodiments, the layer structures of the first and second zones comprise a dielectric core, a top conductive layer and a bottom conductive layer, and wherein the dielectric core of the first zone comprises an inlay of a material having a lower thermal resistance than the dielectric core of the second zone. For example, the inlay is a thermally conductive ceramic material.

In some embodiments, the second zone comprises at least one intermediate conductive layer between the top conductive layer and the bottom conductive layer For example, the conductive layers of the first zone may be configured for a semiconductor power switching device comprising a half-bridge switch topology, each high-side switch and low-side switch of the half-bridge comprising one transistor switch or a plurality of transistor switches connected in parallel; wherein conductive layers of the second zone are configured for driver components for the high-side and the low-side switches. Decoupling capacitors may also be mounted on the second zone.

For example, the conductive layers of the first zone may be configured for a semiconductor power switching device comprising a full-bridge switch topology, each high-side switch and low-side switch of the full-bridge comprising one transistor switch or a plurality of transistor switches connected in parallel; wherein conductive layers of the second zone are configured for driver components for the high-side and the low-side switches.

For example, the conductive layers of the first zone may be configured for a semiconductor power switching device comprising a single switch topology comprising one transistor switch or a plurality of transistor switches connected in parallel; and conductive layers of the second zone are configured for driver components of the single switch.

In some embodiments, there is provided an insulated metal substrate (IMS) for a power stage assembly comprising at least one bottom-cooled semiconductor power switching device and driver components comprising:

a metal support substrate;

a first zone comprising a single-metal IMS structure or a double-metal IMS structure and a second zone comprising a multi-metal IMS structure;

the first zone comprising electrical connections and a thermal pad for mounting the at least one bottom-cooled semiconductor switching device, a layer structure of the first zone being optimized for thermal performance; and the second zone comprising electrical connections for mounting driver components, a layer structure of the second zone being optimized for electrical performance.

For example, in some embodiments the first zone is single metal IMS and the second zone is two-metal IMS. In other embodiments, the first zone is single metal IMS, and the second zone is multi-metal IMS.

In other embodiments, there is provide a substrate for a power stage assembly comprising at least one bottom-cooled semiconductor power switching device and driver components comprising:

a layer stack comprising a first (bottom) conductive layer:

a dielectric core;

a second (top) conductive layer;

in a first zone, the second top conductive layer providing electrical connections and a thermal pad for mounting the at least one bottom-cooled semiconductor switching device, and a thermally conductive inlay extending through the dielectric core between the thermal pad of the second (top) conductive layer and the first (bottom) conductive layer; and in a second zone the first and second conductive layers providing electrical connections for mounting driver components, the second zone comprising a layer structure optimized for electrical performance. For example the substrate is based on an N-layer PCB structure comprising copper metal layers and epoxy composite dielectric layers. The thermally conductive inlay has a lower thermal resistance than the epoxy composite dielectric layers of the second zone. The inlay may be a thermally conductive ceramic inlay.

In other embodiments, there is provided a direct bond copper (DBC) type substrate for a power stage assembly comprising at least one bottom-cooled semiconductor power switching device and driver components comprising:

a support substrate comprising a thermally conductive ceramic material, a first conductive metal layer on a bottom surface of the support substrate and a second conductive metal layer of conductive metal on a top surface of the support substrate;

a second dielectric layer formed on the second conductive layer and a third conductive metal layer formed on the second dielectric layer;

a first zone comprising a single metal interconnect structure and a second zone comprising a multi-layer metal interconnect structure;

the first zone comprising electrical connections and a thermal pad for mounting the at least one bottom-cooled semiconductor switching device, the first zone comprising layers optimized for thermal performance: and a second zone comprising electrical connections for mounting driver components, the second zone comprising layers optimized for electrical performance.

Other aspects provide a power stage assembly, comprising a multi-zone substrate of an embodiment as disclosed herein, at least one power semiconductor switching device and driver circuitry, configured for any one of; a single switch topology; a half-bridge switch topology; a full-bridge switch topology; a multi-level switch topology and other switch topologies.

Each power switching device may be provided as an embedded die package, wherein a thermal pad, and source, drain and gate contact pads are provided on a bottom side of the embedded die package. For example, the power switching devices comprise GaN HEMTs.

For example, power stage assemblies of example embodiments are particularly applicable to III-nitride power switching devices, such as high voltage/high current lateral GaN HEMTs, which provide high current capacity per unit die area and can be packaged in compact embedded die packages which provide high power density and low inductance interconnect In another aspect there is provided a power stage assembly comprising:

a substrate;

at least one bottom-cooled semiconductor power switching device, and driver components;

wherein the substrate comprises:

a first zone comprising electrical connections and a thermal pad for mounting the at least one bottom-cooled semiconductor switching device, the first zone comprising a layer structure optimized for thermal performance; and a second zone comprising electrical connections for mounting driver components, the second zone comprising a layer structure optimized for electrical performance.

For example, the first zone has a first thermal resistance between the thermal pad and a bottom surface of the substrate, and the second zone has a second thermal resistance between top and bottom surfaces of the substrate, wherein the first thermal resistance is significantly less than the second thermal resistance. The first zone may comprise one or more electrically conductive layers and the second zone comprises at least one additional electrically conductive layer. For example, the first zone comprises a single electrically conductive layer and the second zone comprises a plurality of electrically conductive layers.

Conductive and dielectric materials of substrate may be based on an IMS type structure, N-layer PCB type structure, or a DBC type structure.

The layers of the first zone are configured for a semiconductor power switching device of a particular switch topology, for example, for a half-bridge switch topology, each high-side switch and low-side switch of the half-bridge comprising one transistor switch, or a plurality of transistor switches connected in parallel; and conductive layers of the second zone are configured for driver components for the high-side and the low-side switches.

The substrate of the power stage assembly may be mounted on a heatsink. Where the at least one bottom-cooled semiconductor power switching device has dual-side thermal pads, a secondary heatsink may provided on a top side of said semiconductor power switching device.

Substrates for power stage assemblies and power stage assemblies of example embodiments are disclosed which provide for integration of the power switching devices and driver components on a single substrate, and provide an improved or alternative solution, e.g. for at least one of improved thermal performance, layout flexibility, and manufacturability.

BRIEF DESCRIPTION OF THE DRAWINGS

FIG. 1 (Prior Art) shows an example of a GaNPx packaged GaN power transistor with a bottom-side thermal pad;

FIG. 2 (Prior Art) shows a schematic cross-sectional view of an example of a bottom-cooled assembly of a GaNPx packaged GaN power transistor, a PCB substrate, and heatsink for thermal management;

FIG. 6 shows a CAD drawing of a power stage assembly according to a first example embodiment comprising a multi-zone IMS substrate;

FIG. 7 shows a schematic top plan view of the power stage assembly of FIG. 6;

FIG. 8 shows a schematic cross-sectional view of the power stage assembly of FIG. 6;

FIG. 17 shows a schematic diagram to illustrate the interconnect layout of the multi-zone substrate of the example design shown in FIGS. 16A and 16B;

FIGS. 18A, 18B, 18C, 18D and 18E shows a schematic diagrams to illustrate the interconnect layout for each of the four conductive layers of the multi-zone substrate of the example design shown in FIGS. 16A and 16B;

FIGS. 21A and 21B show a schematic cross-sectional diagrams of multi-zone DBC type substrates of example embodiments;

FIGS. 22A, 22B and 22C show schematic cross-sectional diagrams of a multi-zone substrates of example embodiments wherein zone 1 comprises one or more ceramic inlays.

Figure 3:
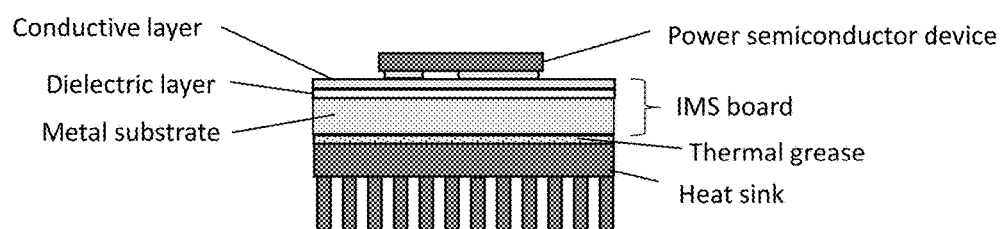
FIG. 3 (Prior Art) shows a schematic cross-sectional view of an example of an assembly of a bottom-cooled GaNPx packaged GaN power transistor, wherein the PCB substrate is an IMS board, which is mounted on a heatsink.

The foregoing and other features, aspects and advantages will become more apparent from the following detailed description, taken in conjunction with the accompanying drawings, of example embodiments, which description is by way of example only.

DETAILED DESCRIPTION

Device structures for enhancement-mode (E-mode) lateral GaN power transistors are described, for example, in U.S. Pat. No. 11,139,373, issued Oct. 5, 2021, entitled "Scalable circuit-under-pad device topologies for lateral GaN power transistors", U.S. patent application Ser. No. 17/085,137 filed Oct. 30, 2020, entitled "Device topologies for high current lateral power semiconductor devices", and references cited therein. For example, GaN-on-Silicon devices structures for a GaN HEMT may comprise a silicon substrate, and an epitaxial layer structure (epi-layer stack or epi-layers) formed on the silicon substrate, comprising a GaN heterostructure, e.g. a GaN barrier layer and an AlGaN channel layer to provide a 2DEG active region. Source, drain and gate contact areas of lateral GaN power transistors are provided on the front-side (may be referred to as the "active side") of the die. The back-side of the die, e.g. a metallization layer on the back-side of the silicon substrate, provides a thermal contact area. While GaN HEMTs may be supplied as a bare die, various forms of embedded die packaging with low inductance interconnect may be provided to allow for either top-side thermal pads or bottom-side thermal pads.

Examples of embedded die packaging for E-mode lateral GaN power transistors are disclosed, for example, in U.S. patent application Ser. No. 16/928,305, filed Jul. 14, 2020, entitled "Embedded die packaging for power semiconductor devices"; U.S. Pat. No. 9,659,854, entitled "Embedded Packaging for Devices and Systems Comprising Lateral GaN Power Transistors"; U.S. Pat. No. 9,589,868, entitled "Packaging Solutions for Devices and Systems Comprising Lateral GaN Power Transistors"; and U.S. Pat. No. 9,589,869, entitled "Packaging Solutions for Devices and Systems Comprising Lateral GaN Power Transistors"; U.S. Pat. No. 9,824,949, entitled "Packaging Solutions for Devices and Systems Comprising Lateral GaN Power Transistors".

GaN Systems Inc. GaNPx® embedded die packaging can be configured for top-side or bottom-side cooling. For example, FIG. 1 (Prior Art) shows an example of a GaN power transistor packaged in a "bottom-cooled" or "B-type" GaNPx type package, wherein the contact pads for the source, drain and gate, and a thermal pad are provided on one side of the package. In this example the thermal pad acts as a source pad.

FIG. 2 shows a schematic cross-sectional view of an example of a bottom-cooled assembly of a GaNPx packaged GaN power transistor and a PCB substrate, and heatsink for thermal management. In this configuration, the thermal pad and source, drain, and gate contacts are provided on one side of the package. The packaged GaN power transistor is mounted, e.g. by soldering, on a PCB, which provides electrical connections to the source, drain and gate contacts. The thermal pad is in thermal contact with thermal vias which extend through the PCB to a thermal pad on the opposite side of the PCB. The PCB is mounted on a heatsink. The thermal pad of the embedded die package is in thermal contact with the heatsink through a layer of thermal interface material (TIM). FIG. 2 illustrates schematically elements of the thermal resistance of various components in the thermal path which contribute to conductive and convective heat dissipation. These elements include: the thermal resistance between the junction and the electrical contracts on the die $R_{th}JC$; the thermal resistance of the solder connection between the die contacts and the respective top conductive traces of the PCB, $R_{th}$solder; the thermal resistance of the PCB $R_{th}$PCB; the thermal resistance of the TIM $R_{th}$TIM; and the thermal resistance of the heatsink to ambient $R_{th}$HS-A. The overall thermal resistance between the junction and ambient may be referred to as $R_{th}JA$. The junction temperature Tj is dependent on the sum of the ambient temperature $T_A$, the power loss of the GaN HEMT, and the thermal resistance of the heatsink to ambient $R_{th}$HS-A:

$$Tj=T_A+P{\times}R_{th}JA$$

The excellent electrical performance Figure of Merit for GaN HEMTs limits the overall power loss. Thermal design to reduce the overall thermal resistance $R_{th}JA$ is importance to optimize device performance, e.g. by reducing Tj to reduce overall conduction and switching losses and improve system reliability.

For a bottom-cooled power assembly, e.g. as illustrated schematically in FIG. 2, where both electrical connections and the thermal pad are on one side of the device package, thermal dissipation of power module assemblies comprising FR4 type PCB technology with copper thermal vias, the relatively high thermal resistance of the PCB and solder connections, and TIM, may be a limiting factor. FR4 PCB technology is a mature process, and provides layout flexibility and low cost, but the FR4 dielectrics have relatively high thermal resistance (e.g. ~0.25 W/mK).

Thermal resistance for bottom-cooled assemblies can be reduced by using an Insulated Metal Substrate (IMS) PCB, as illustrated in the example shown in FIG. 3. An IMS PCB provides reduced thermal resistance. IMS PCBs may be referred to as single-layer IMS when only one conductive metal layer is provided for electrical connections. IMS PCBs may be referred to as two-layer IMS, or multi-layer IMS, when two or more conductive metal layers are provided for electrical connections.

Figure 4:
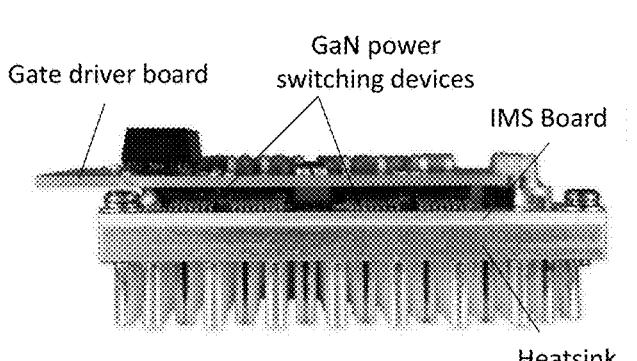
FIG. 4 (Prior Art) shows a photograph of a side view of a power stage assembly comprising a half-bridge power switching stage mounted on an IMS board; a heat sink; and a gate driver board.
Figure 5:
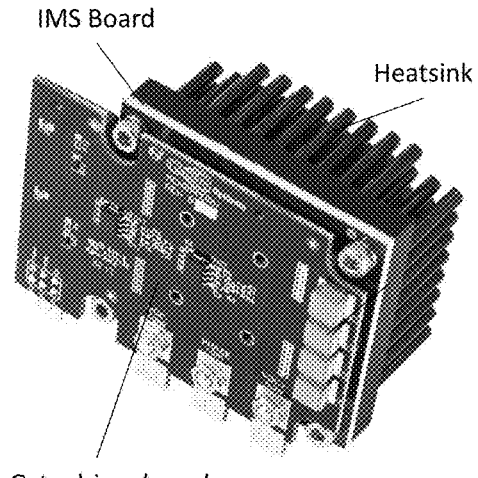
FIG. 5 (Prior Art) shows a photograph of an oblique view of the power stage assembly of FIG. 5.

FIGS. 4 and 5 show an example of a bottom-cooled IMS power stage assembly for a power semiconductor switching device comprising a half-bridge switch topology, wherein the high-side and low-side switches comprises GaN HEMTs. The assembly comprise a IMS PCB on which the GaN half-bridge is mounted, a heatsink, and a gate driver board which is mounted on the IMS PCB. An example IMS PCB may comprise an isolated aluminum (Al) or copper (Cu) substrate/support layer, a dielectric layer (e.g. 30 μm to 200 μm of a dielectric such as thermal prepreg (epoxy composite), having a thermal conductivity in a range of e.g. 1-5 W/mK), and a conductive layer of copper foil (e.g. e.g. 35 μm to 140 μm) which is patterned to provide electrical connections. Use of an IMS PCB and thermal grease between the IMS PCB and the heatsink, as illustrated schematically in FIG. 3, may significantly reduce thermal resistance relative to an assembly comprising a conventional FR4 type PCB, mounted on a heatsink with TIM, as illustrated schematically in FIG. 2.

A single conductive layer IMS board provides excellent thermal performance, but since a single conductive layer limits electrical connections, a separate driver board is used for mounting of driver components. For example, in a conventional IMS power module assembly, such as illustrated in FIGS. 4 and 5, the power switching devices are mounted on a single conductive layer IMS board, and driver components are provided on a separate driver board, which is then mounted on the IMS board, adding to complexity of fabrication and assembly. Multi-layer IMS boards, comprising two or more electrically conductive layers, provide more flexibility for layout of electrical connections, but the additional layers introduce thermal resistance, which reduces thermal performance.

FIG. 6 shows a CAD drawing of a power stage assembly according to a first example embodiment comprising a multi-zone substrate, wherein the power stage has a half-bridge switch topology. The power switching components, in this example, the high-side and low-side switches Q1 and Q2 of the half-bridge, and the gate driver circuit components are mounted on a single substrate.

FIG. 7 shows a schematic top plan view of the power stage assembly of FIG. 6. The high-side switch Q1 and low-side switch Q2 are mounted on a first zone of the substrate, which comprises single-metal IMS. The gate driver components are mounted on a second zone of the substrate with comprises multi-metal IMS. FIG. 8 shows a schematic cross-sectional view of the power stage assembly of FIG. 6 and FIG. 7 to show the layer structure (layup). The rigid metal substrate is several mm thick and provides a support layer; it may be a layer of aluminum or copper, or other thermally conductive metal. The single metal IMS structure in the first zone comprises a first dielectric layer, e.g. an epoxy composition, such as a FR4 type dielectric, and a first conductive metal layer, e.g. copper, which provides a single metal IMS structure in the first zone. The multi-metal IMS structure in the second zone comprises the first dielectric layer, the first conductive metal layer, a second dielectric layer and a second conductive layer. In this way, the first zone (zone 1) of the substrate can be optimized for thermal performance and the second zone (zone 2) of the substrate can be optimized for electrical performance. For example, in this embodiment, the power switching devices are mounted on zone 1, which comprises only the first dielectric layer and the first conductive layer, to provide electrical connections to the power switching devices, with a thermal path having first thermal resistance $R_{th}$(zone 1) between the power switching device and the metal substrate. In zone 2, the additional second dielectric layer and second conductive metal layer provides for more flexibility in routing of electrical interconnections of the driver circuitry. These additional layers add to the thermal resistance of the second zone, $R_{th}$(zone 2), but the additional conductive layer allows more flexibility for layout of electrical connections, for optimization of electrical performance.

Figure 9:
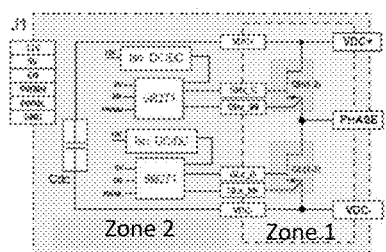
FIG. 9 shows a functional block diagram of a half-bridge power switching device and driver circuitry of an example embodiment.

FIG. 9 shows a functional block diagram of a half-bridge power switching device and driver circuitry of an example embodiment to illustrate how components are distributed between the first zone, on which the power switching devices are mounted, and the second zone, on which the driver components are mounted. The first and second conductive metal layers provide interconnections between the driver components and the power switching devices.

Figure 10:
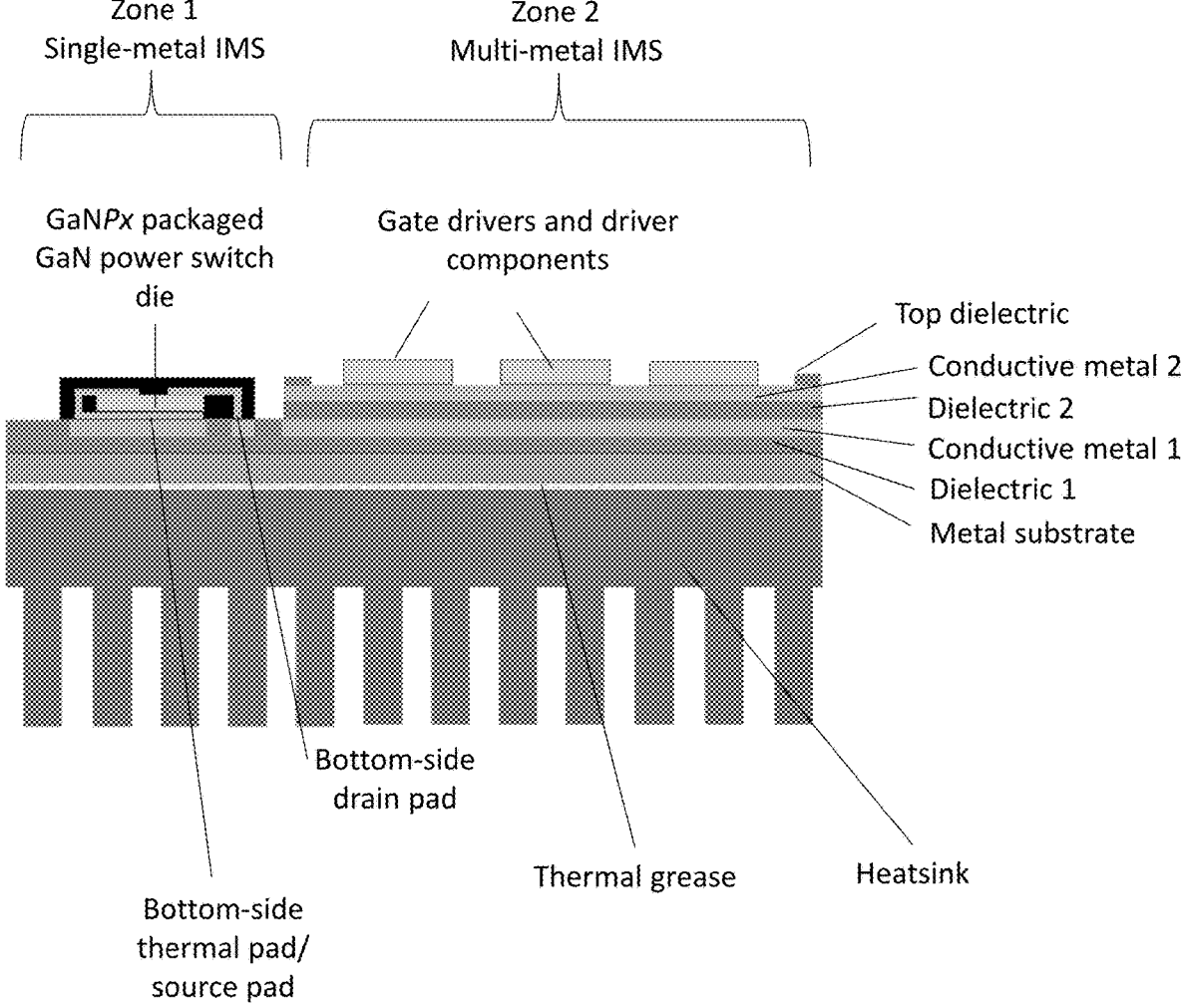
FIG. 10 shows a schematic cross-sectional view of a power stage assembly of a second example embodiment comprising a multi-zone IMS substrate and a heatsink.

FIG. 10 shows a schematic cross-sectional view of a power stage assembly of a second example embodiment comprising a multi-zone substrate and a heatsink. The multi-zone IMS board is mounted on the heatsink with a layer of thermal grease for thermal contact. Two conductive metal layers are shown in zone 2 to provide a dual-metal IMS zone for mounting of the driver components. In variants of the multi-zone substrate, if required, additional dielectric and conductive layers may be provided in zone 2, e.g. as illustrated schematically in FIG. 20.

Figure 11:
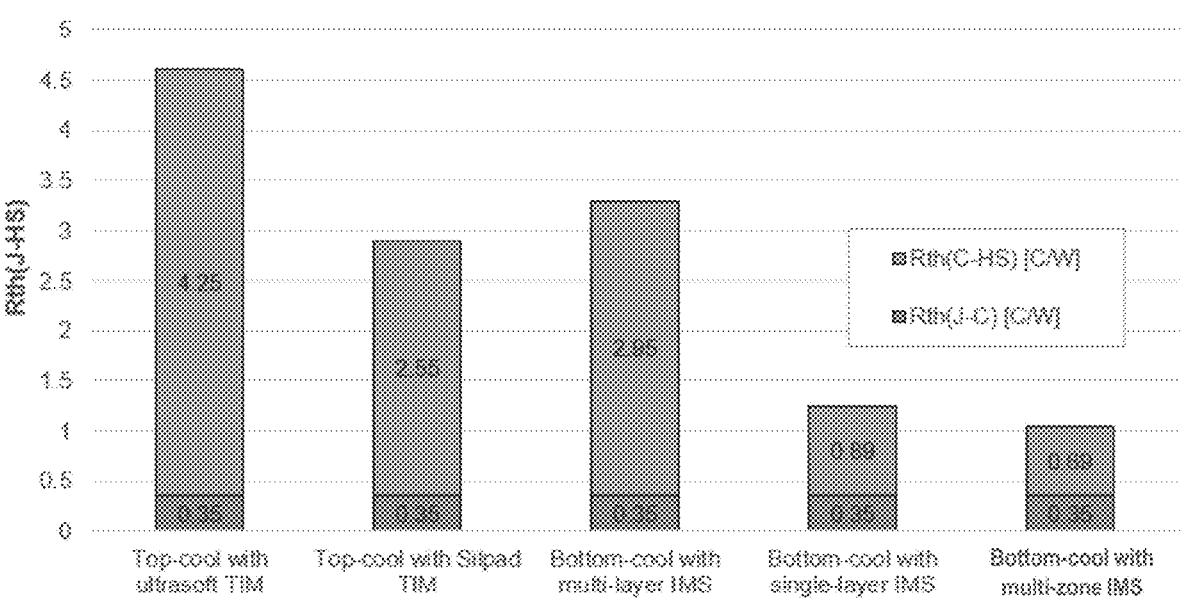
FIG. 11 shows a chart which compares the thermal resistance of power stage assemblies using different types of substrates.

FIG. 11 shows a chart which compares the junction-to-heatsink thermal resistance of power stage assemblies of five different types. The bars include the junction-to-contact thermal resistance $R_{th}$(J-C) (C/W) of the packaged die, which is the same for each example, and the contact to heatsink thermal resistance $R_{th}$(C-HS) (C/W), which is dependent on which type of assembly is used. The first two bars compare top-cooled assemblies using different thermal interface materials (TIM), to illustrate that these type of top-cooled assemblies are strongly dependent on the choice of TIM (Ultra-soft TIM vs. Silpad TIM). Bars three and four compare bottom-cooled power stage assemblies using a multi-metal layer IMS board and single-metal layer IMS board. While a multi-layer metal IMS board provides an additional conductive layer for increased flexibility in layout of electrical interconnect, for improved electrical performance, the additional layers add significant thermal resistance. A single-metal layer IMS board reduces thermal resistance, but also reduces flexibility in routing of interconnect, limiting optimization of electrical performance, and/or necessitating that driver components are mounted on a separate driver PCB. The fifth bar shows the thermal resistance for a bottom-cooled power stage assembly of an example embodiment comprising a multi-zone substrate, which provides reduced thermal resistance in zone 1, for mounting of the power switching devices, and an additional layer of metal interconnect in zone 2, which provides for more flexibility in routing of interconnections of the driver components, for improved electrical performance.

Figure 12:
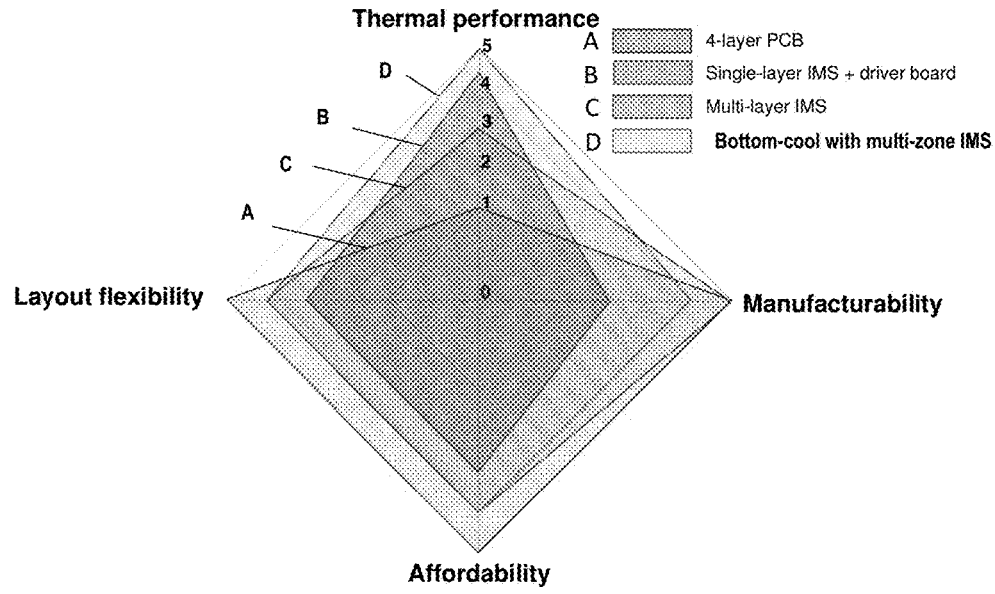
FIG. 12 shows a chart comparing thermal performance, manufacturability, affordability and layout flexibility of four types of power stage assemblies.

FIG. 12 shows a chart comparing thermal performance, manufacturability, affordability and layout flexibility of four types of power stage assemblies. Plot A is for a bottom-cooled assembly using a conventional 4-layer PCB using four copper conductive layers and FR4 type dielectric layers. Plot B is for a bottom-cooled assembly using single-metal layer IMS. Plot C is for a bottom-cooled assembly using multi-metal layer IMS. Plot D is for a bottom-cooled assembly of an example embodiment wherein the substrate is a multi-zone IMS structure. As illustrated schematically, conventional PCB substrates, e.g. 4-layer PCBs, are mature technology which provide for layout flexibility and manufacturability, at low-cost, but relatively poor thermal performance, due to the high thermal resistance of dielectrics which are epoxy composites, such as FR4 type dielectrics. Substrates based on single-metal layer IMS offer reduced thermal resistance, for improved thermal performance, with reduced layout flexibility, which limits electrical performance or necessitate a second substrate for other electrical components, which adds to complexity of fabrication and assembly (reduced manufacturability). Substrates based on multi-metal layer IMS improve layout flexibility, but add to thermal resistance, reducing thermal performance. Substrates using multi-zone IMS allow for optimization of thermal performance of a first zone on which power switching devices are mounted, and optimization of the electrical performance of a second zone on which driver components are mounted.

For example, integrating the power switching devices and the driver components on a single multi-zone substrate, eliminates a conventional multi-board assembly, and soldering of components can be completed in a single reflow. Decoupling capacitors may also be included on the multi-zone substrate.

Figure 13:
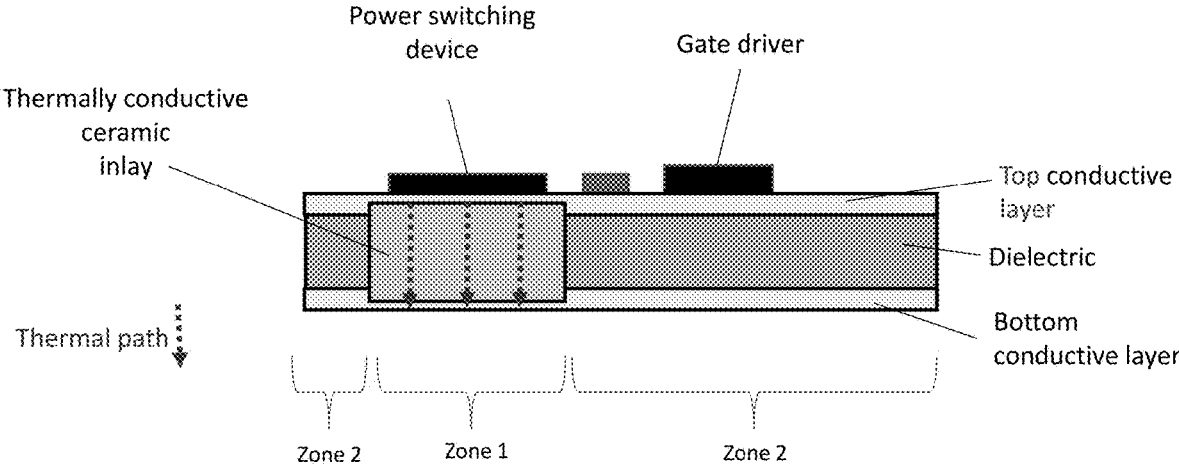
FIG. 13 shows a schematic cross-sectional view of a power stage assembly of a third example embodiment comprising a multi-zone substrate.

FIG. 13 shows a schematic cross-sectional view of a power stage assembly of a third example embodiment comprising a multi-zone substrate. In this embodiment the gate driver components are mounted on zone 2, which is a multi-layer PCB structure. The multi-layer PCB structure comprises a dielectric core, e.g. an epoxy composite, and bottom and top conductive metal layers, e.g. copper layers. In zone 1, the dielectric core is replaced by a thermally conductive ceramic inlay, to provide a thermal path with reduced thermal resistance between the thermal pad on the top side of the substrate and the back-side of the substrate.

Figure 14:
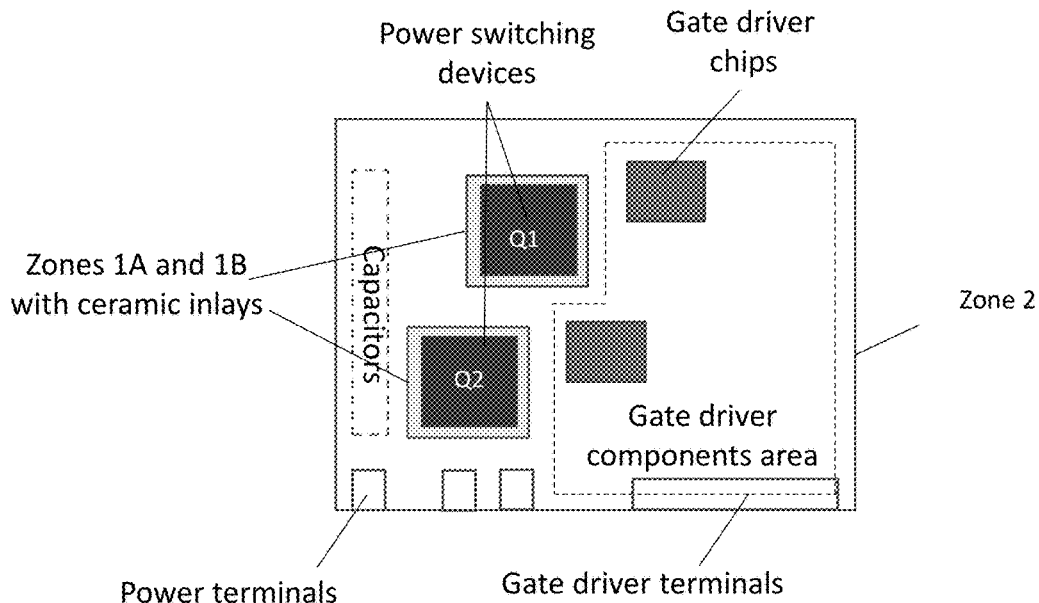
FIG. 14 shows a schematic top plan view of a power stage assembly of the third example embodiment comprising a multi-zone substrate.

FIG. 14 shows a schematic top plan view of a power stage assembly of the third example embodiment. As illustrated schematically, zone 1 comprises two separate thermally conductive ceramic inlays 1A and 1B. The power switching devices Q1 and Q2 of the half-bridge are each mounted on separate ceramic inlays. In this example, Zone 2, on which the driver components are mounted, extends around zones 1A and 1B. The top and bottom metal conductive layers provide for optimizing routing of electrical connections for the driver components.

Figure 15:
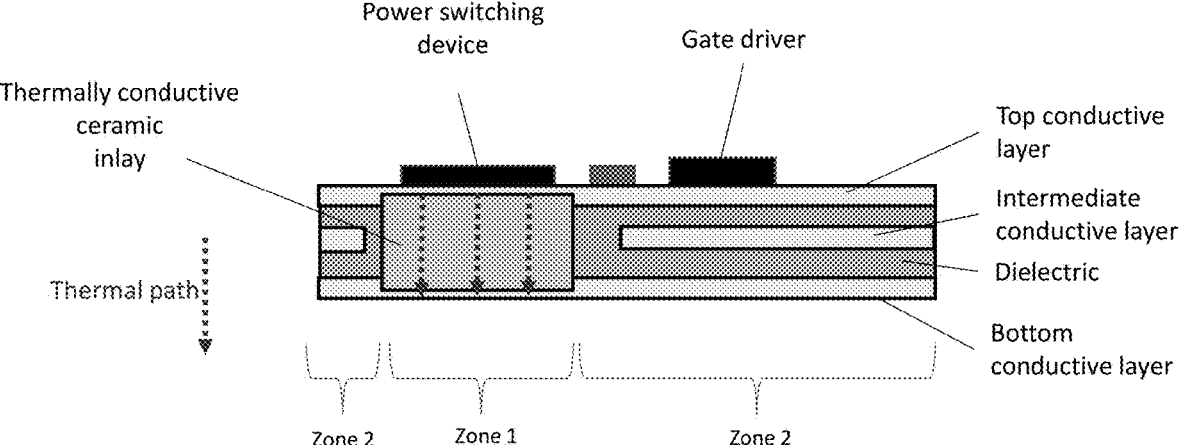
FIG. 15 shows a schematic top plan view of a power stage assembly of a fourth example embodiment comprising a multi-zone substrate.

FIG. 15 shows a schematic cross-sectional view of a power stage assembly of a fourth example embodiment comprising a multi-zone substrate. In this embodiment the gate driver components are mounted on zone 2, which is a multi-layer PCB structure. The multi-layer PCB structure comprises a dielectric core, e.g. an epoxy composite, and bottom and top conductive metal layers, e.g. copper layers. Compared to the structure shown in FIG. 13, an additional intermediate conductive metal layer, e.g. another copper layer is provided. In zone 1, the dielectric core is replaced by a thermally conductive ceramic inlay, to provide a thermal path with reduced thermal resistance between the thermal pad on the top side of the substrate and the back-side of the substrate. The top, intermediate and bottom metal conductive layers provide for optimizing routing of electrical connections for the driver components. In variants of this embodiment, zone 2 may comprise one or more additional intermediate conductive metal layers and dielectric layers.

Figure 16A:
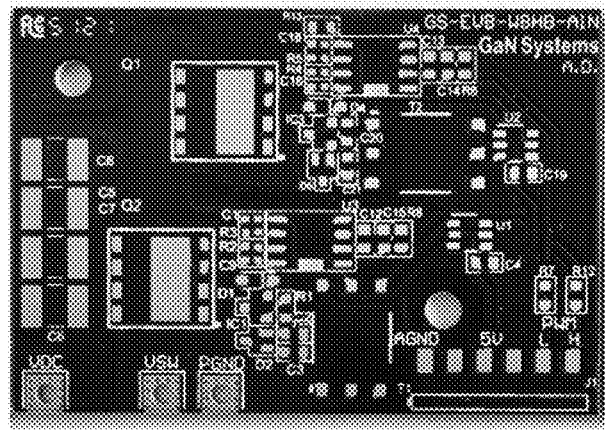
FIG. 16A shows a top view of a design example of a multi-zone substrate for a power stage assembly.
Figure 16B:
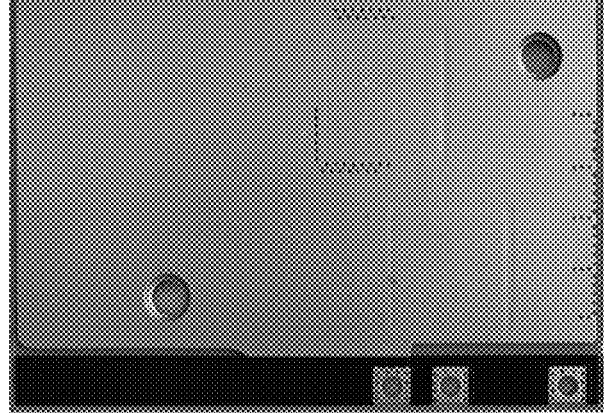
FIG. 16B shows a bottom view of the design example of the multi-zone substrate shown in FIG. 16A.

FIG. 16A shows a top view of a design example of a multi-zone substrate for a power stage assembly, to show electrical contact pads thermal pads for mounting of power switching devices Q1 and Q2, and electrical contact pads for mounting of driver components. FIG. 16B shows a bottom view of the design example of the multi-zone substrate shown in FIG. 16A, to show a large area thermal pad.

FIG. 17 shows a diagram to illustrate the interconnect layout of conductive layers the multi-zone substrate of the example design shown in FIGS. 16A and 16B, and to indicate locations of ceramic inlay areas of Zone 1.

FIGS. 18A to 18D show the layout and routing of individual conductive metal layers of the design example shown in FIG. 17. FIG. 18E shows the positions of the ceramic inlays of zone 1.

Figure 19:
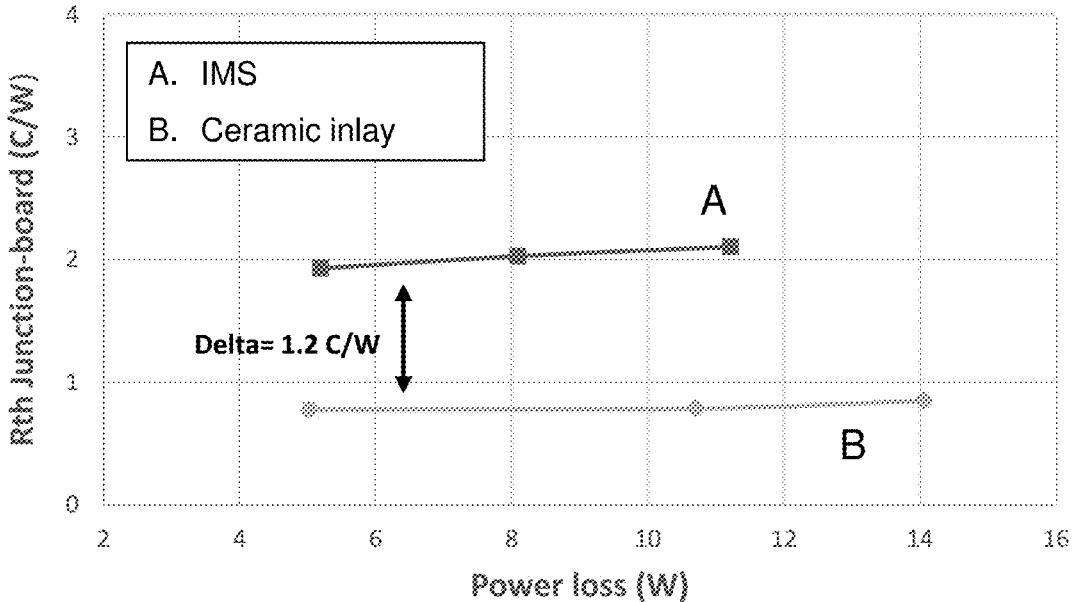
FIG. 19 shows a plot comparing of the junction to board thermal resistance Rth (C/W) vs. power loss (W) for the power stage assemblies of example embodiments comprising a GaN half-bridge implemented with A. a multi-zone IMS board and B. a multi-zone PCB with ceramic inlay.

FIG. 19 shows a plot comparing of the junction-to-board thermal resistance $R_{th}$ (C/W) vs. power loss (W) for the power stage assemblies of example embodiments comprising a GaN half-bridge for A. multi-zone IMS and B. a substrate with thermally conductive ceramic inlays.

Figure 20:
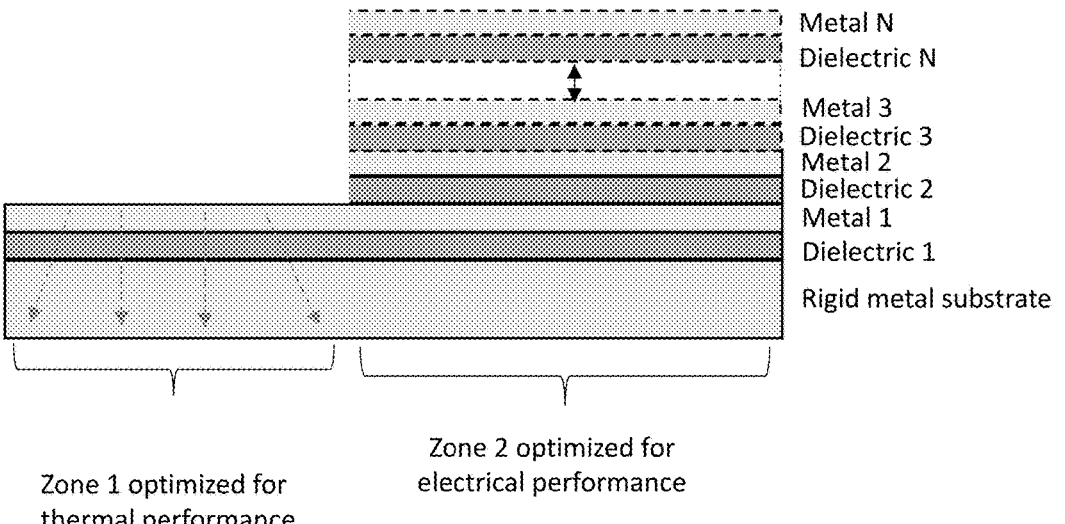
FIG. 20 show a schematic cross-sectional diagrams of a multi-zone IMS type substrate of another example embodiment.

FIG. 20 show a schematic cross-sectional diagrams of a multi-zone substrate of another example embodiment comprising a multi-metal layer IMS type multi-zone substrate, wherein zone 1 has a single-metal IMS structure and zone 2 has a multi-metal layer IMS structure, which comprises 2 or 3 metal layers, or optionally N-metal layers. The rigid metal substrate provides a supporting layer, e.g. comprising aluminum or copper. Dielectric layers may be epoxy-composites, and conductive metal layers may be copper.

FIGS. 21A and 21B show a schematic cross-sectional diagrams of multi-zone substrates of other example embodiments comprising a multi-metal layer DBC multi-zone substrate. In the structure shown in FIG. 21A, zone 1 has a DBC structure with top and bottom conductive metal layers and zone 2 has a multi-metal layer DBC structure with an additional conductive metal layer. In the structure shown in FIG. 21B, zone 1 has layer DBC structure with top and bottom conductive metal layers and zone 2 has a multi-metal layer DBC structure with two additional conductive metal layers. In these examples, dielectric 1 is a rigid thermally conductive ceramic substrate, to provide a supporting layer. Additional dielectric layers may be ceramic dielectrics or epoxy composition dielectrics, such as FR4 type dielectrics. Conductive metal layers may be copper.

FIGS. 22A, 22B and 22C show a schematic cross-sectional diagrams of multi-zone substrates of other example embodiments comprising ceramic inlay. These structures are variants of the structures shown in FIGS. 13 to 15, to illustrate substrate structures with different numbers of conductive metal layers. Where the substrate supports multiple power switching devices, each may be mounted on an individual ceramic inlay, as illustrated schematically in FIGS. 22A and 22B, so that each has a separate thermal path. Alternatively, two or more power switching devices may share a ceramic inlay, e.g. be mounted on a common ceramic inlay, as illustrated schematically in FIG. 22C.

Figure 23:
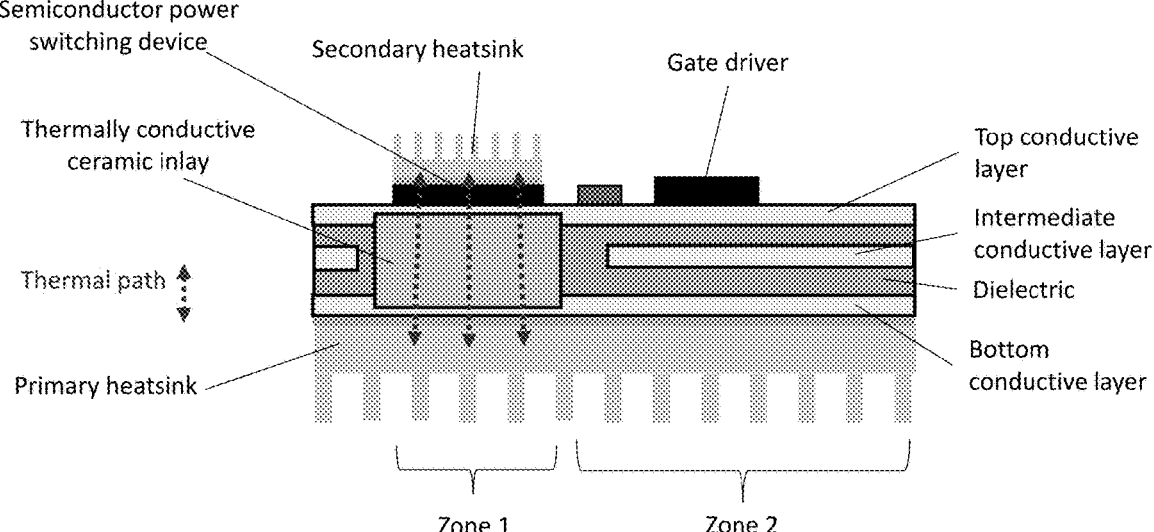
FIG. 23 shows a schematic cross-sectional diagram of power stage assembly of an example embodiment providing dual-side cooling of the power semiconductor switching devices.

A power stage assembly of yet another embodiment, as illustrated schematically in FIG. 23, comprises a multi-zone substrate and dual-side cooling. For example, the assembly shown in FIG. 23 comprises elements similar to the embodiment shown in FIG. 15, which are mounted on a heatsink. In this example, the power switching device is packaged in an embedded die package that provides dual-side thermal pads, and a secondary heat sink is mounted on the top side of the power switching device to provide for dual side cooling. Unlike the conventional IMS assembly shown in FIG. 5, where a separate driver board is mounted on the IMS board, a multi-zone substrate of an embodiment in which the power semiconductor switching devices are mounted on a first zone and driver components are mounted on a second zone of a single substrate, provides increased flexibility for dual-side cooling using a secondary heatsink.

Power stage assemblies of example embodiments are described herein, comprising multi-zone substrates, wherein a first zone is optimized for thermal performance and a second zone is optimized for electrical performance. The first zone has a first thermal resistance between the thermal pad on which the power switching device is mounted and the bottom of the substrate, and the second zone has a second thermal resistance between top and bottom surfaces, and the layer structures of each zone provide that the first thermal resistance is significantly less than the second thermal resistance. If required, additional electrically conductive layers are provided in the second zone to facilitate routing of electrical connections and optimization of electrical performance.

By way of example, some example embodiments are described for a power switching stage comprising a half-bridge topology, comprising a high-side switch Q1 and a low-side switch Q2, each comprising a single packaged power switching device. In alternative embodiments: each of the high-side switch and the low side switch may comprise multiple power switching devices connected in parallel; power stage assemblies may be based on single switch topology, a half-bridge topology, full-bridge topology, multi-level switch topology, or other switch topology. Power stage assemblies of example embodiments are described to illustrate how a significant enhancement of the thermal performance of a bottom-cooled device may be achieved, while maintain a good switching performance. These factors contribute to improving the cost per unit power (e.g. $/W) on system level.

While power stage assemblies of example embodiments have been described in detail with reference to semiconductor power switching devices comprising lateral GaN transistors, such as a high voltage/high current GaN HEMTs, wherein active layers comprise GaN/AlGaN hetero-layer structures, it will be apparent that nitride semiconductor device structures according to alternative embodiments may comprise lateral GaN power transistors and/or diodes. More generally, a nitride semiconductor device comprises a III-nitride semiconductor, that is, a compound semiconductor which includes nitrogen and at least one group III element, such as GaN, AlGaN, AlN, InGaN, InAlGaN, and the nitride semiconductor device structure comprises a hetero-layer structure comprising first and second nitride semiconductor layers of different bandgaps, that forms an active region comprising a two-dimensional electron gas (2DEG) region for transistors and/or diodes.

Power stage assemblies providing improved bottom-cooling and performance, as disclosed herein for GaN power switching devices, may be applicable more generally to power switching devices fabricated using other semiconductor technologies, where it is required to provide bottom-cooling.

Although embodiments of the invention have been described and illustrated in detail, it is to be clearly understood that the same is by way of illustration and example only and not to be taken by way of limitation, the scope of the present invention being limited only by the appended claims.

The invention claimed is:

1. A substrate for a power stage assembly comprising at least one bottom-cooled semiconductor power switching device and driver components, comprising:

a first zone comprising electrical connections and a thermal pad for mounting the at least one bottom-cooled semiconductor switching device, the first zone comprising a layer structure optimized for thermal performance; and a second zone comprising electrical connections for mounting driver components, the second zone comprising a layer structure optimized for electrical performance, wherein the first zone has a first thermal resistance between the thermal pad and a bottom surface of the substrate, and the second zone has a second thermal resistance between top and bottom surfaces of the substrate, wherein the first thermal resistance is significantly less than the second thermal resistance.

2. The substrate of claim 1, wherein first zone has a first thermal resistance between the thermal pad and a bottom surface of the substrate, and the second zone has a second thermal resistance between top and bottom surfaces of the substrate, wherein the first thermal resistance is significantly less than the second thermal resistance.

3. The substrate of claim 1, wherein the first zone comprises one or more electrically conductive layers and the second zone comprises at least one additional electrically conductive layer.

4. The substrate of claim 3, wherein the first zone comprises a single electrically conductive layer and the second zone comprises a plurality of electrically conductive layers.

5. The substrate of claim 3, wherein the layer structures of the first and second zones comprise a dielectric core, a top conductive layer and a bottom conductive layer, and wherein the dielectric core of the first zone comprises an inlay of a material having a lower thermal resistance than the dielectric core of the second zone.

6. The substrate of claim 5, wherein the second zone comprises at least one intermediate conductive layer between the top conductive layer and the bottom conductive layer.

7. The substrate of claim 5, wherein the second zone comprises a plurality of intermediate conductive layers and dielectric layers between the top conductive layer and the bottom conductive layer.

8. The substrate of claim 3, wherein the conductive layers of the first zone are configured for a semiconductor power switching device comprising a half-bridge switch topology, each high-side switch and low-side switch of the half-bridge comprising one transistor switch or a plurality of transistor switches connected in parallel; and conductive layers of the second zone are configured for driver components for the high-side and the low-side switches.

9. The substrate of claim 3, wherein the conductive layers of the first zone are configured for a semiconductor power switching device comprising a full-bridge switch topology, each high-side switch and low-side switch of the full-bridge comprising one transistor switch or a plurality of transistor switches connected in parallel; and conductive layers of the second zone are configured for driver components for the high-side and the low-side switches.

10. The substrate of claim 3, wherein the conductive layers of the first zone are configured for a semiconductor power switching device comprising a single switch topology comprising one transistor switch or a plurality of transistor switches connected in parallel; and conductive layers of the second zone are configured for driver components of the single switch.

11. An insulated metal substrate (IMS) for a power stage assembly comprising at least one bottom-cooled semiconductor power switching device and driver components comprising:

a metal support substrate;

a first zone comprising a single-metal IMS or a double-metal IMS structure comprising one or two conductive metal layers and a second zone comprising a multi-metal IMS structure comprising at least one additional conductive metal layer;

the first zone comprising electrical connections and a thermal pad for mounting the at least one bottom-cooled semiconductor switching device, a layer structure of the first zone being optimized for thermal performance; and the second zone comprising electrical connections for mounting driver components, a layer structure of the second zone being optimized for electrical performance, wherein the first zone has a first thermal resistance between the thermal pad and a bottom surface of the substrate, and the second zone has a second thermal resistance between top and bottom surfaces of the substrate, wherein the first thermal resistance is significantly less than the second thermal resistance.

12. The insulated metal substrate (IMS) of claim 11, wherein the first zone is a single-metal IMS structure and the second zone is a 2-metal IMS structure.

13. The insulated metal substrate (IMS) of claim 11, wherein the first zone is a single-metal IMS structure and the second zone is a multi-metal IMS structure.

14. A substrate for a power stage assembly comprising at least one bottom-cooled semiconductor power switching device and driver components comprising:

a layer stack comprising a first electrically conductive layer:

a dielectric core;

a second electrically conductive layer;

in a first zone, the second electrically conductive layer providing electrical connections and a thermal pad for mounting the at least one bottom-cooled semiconductor switching device, and a thermally conductive inlay extending through the dielectric core between the thermal pad of the second electrically conductive layer and the first electrically conductive layer; and in a second zone, the first and second electrically conductive layers providing electrical connections for mounting driver components, the second zone comprising a layer structure optimized for electrical performance, wherein the first zone has a first thermal resistance between the thermal pad and a bottom surface of the substrate, and the second zone has a second thermal resistance between top and bottom surfaces of the substrate, wherein the first thermal resistance is significantly less than the second thermal resistance.

15. The substrate of claim 14, wherein the second zone comprises at least one intermediate electrically conductive layer.

16. The substrate of claim 15, wherein the second zone comprises a plurality of intermediate electrically conductive layers.

17. The substrate of claim 14, wherein the thermally conductive inlay is a thermally conductive ceramic inlay.

18. The substrate of claim 14, wherein a separate thermally conductive inlay is provided for each power switching device.

19. The substrate of claim 14, wherein each thermally conductive inlay is shared by a plurality of power switching devices.

20. The substrate of claim 14, wherein the electrically conductive layers and dielectric layers are provided by an N-metal layer PCB structure, wherein for zone 2, N is >2.

21. A direct bond copper (DBC) type substrate for a power stage assembly comprising at least one bottom-cooled semiconductor power switching device and driver components comprising:

a support substrate comprising a thermally conductive ceramic material, a first electrically conductive metal layer on a bottom surface of the support substrate and a second electrically conductive metal layer on a top surface of the support substrate;

a second dielectric layer formed on the second electrically conductive layer and a third electrically conductive metal layer formed on the second dielectric layer;

a first zone comprising a single metal interconnect structure and a second zone comprising a multi-layer metal interconnect structure; the first zone comprising electrical connections and a thermal pad for mounting the at least one bottom-cooled semiconductor switching device, the first zone comprising layers optimized for thermal performance; and a second zone comprising electrical connections for mounting driver components, the second zone comprising layers optimized for electrical performance, wherein the first zone has a first thermal resistance between the thermal pad and a bottom surface of the substrate, and the second zone has a second thermal resistance between top and bottom surfaces of the substrate, wherein the first thermal resistance is significantly less than the second thermal resistance.

22. The direct bond copper (DBC) type substrate of claim 21, wherein the second zone comprises a plurality of additional dielectric layers and electrically conductive metal layers.

23. A power stage assembly, comprising a substrate as defined in claim 1, and at least one power semiconductor switching device and driver circuitry, configured for any one of;

a single switch topology;

a half-bridge switch topology;

a full-bridge switch topology.

24. The power stage assembly of claim 23, wherein each power switching device is provided as an embedded die package, wherein a thermal pad, and source, drain and gate contact pads are provided on a bottom side of the embedded die package.

25. The power stage assembly of claim 24, wherein each power switching device is a GaN HEMTs.

26. The power stage assembly of claim 23, wherein the substrate is mounted on a heatsink.

27. A power stage assembly comprising:

a substrate;

at least one bottom-cooled semiconductor power switching device, and driver components;

wherein the substrate comprises:

a first zone comprising electrical connections and a thermal pad for mounting the at least one bottom-cooled semiconductor switching device, the first zone comprising a layer structure optimized for thermal performance; and a second zone comprising electrical connections for the mounting driver components, the second zone comprising a layer structure optimized for electrical performance, wherein the first zone has a first thermal resistance between the thermal pad and a bottom surface of the substrate, and the second zone has a second thermal resistance between top and bottom surfaces of the substrate, wherein the first thermal resistance is significantly less than the second thermal resistance.

28. The power stage assembly of claim 27, wherein the first zone comprises one or more electrically conductive layers and the second zone comprises at least one additional electrically conductive layer.

29. The power stage assembly of claim 27, wherein the first zone comprises a single electrically conductive layer and the second zone comprises a plurality of electrically conductive layers.

30. The power stage assembly of claim 28, wherein the layer structures of the first and second zones comprise a dielectric core, a top conductive layer and a bottom conductive layer, and wherein the dielectric core of the first zone comprises an inlay of a material having a lower thermal resistance than the dielectric core of the second zone.

31. The power stage assembly of claim 30, wherein the second zone comprises at least one intermediate conductive layer between the top conductive layer and the bottom conductive layer.

32. The power stage assembly of claim 30, wherein the second zone comprises a plurality of intermediate conductive layers and dielectric layers between the top conductive layer and the bottom conductive layer.

33. The power stage assembly of claim 28, wherein the conductive layers of the first zone are configured for a semiconductor power switching device comprising a half-bridge switch topology, each high-side switch and low-side switch of the half-bridge comprising one transistor switch or a plurality of transistor switches connected in parallel; and conductive layers of the second zone are configured for driver components for the high-side and the low-side switches.

34. The power stage assembly of claim 28, wherein the conductive layers of the first zone are configured for a semiconductor power switching device comprising a full-bridge switch topology, each high-side switch and low-side switch of the full-bridge comprising one transistor switch or a plurality of transistor switches connected in parallel; and conductive layers of the second zone are configured for driver components for the high-side and the low-side switches.

35. The power stage assembly of claim 28, wherein the conductive layers of the first zone are configured for a semiconductor power switching device comprising a single switch topology comprising one transistor switch or a plurality of transistor switches connected in parallel; and conductive layers of the second zone are configured for driver components of the single switch.

36. The power stage assembly of claim 28, wherein the substrate is mounted on a heatsink.

37. The power stage assembly of claim 36, wherein the at least one bottom-cooled semiconductor power switching device has dual-side thermal pads, and a secondary heatsink is provided on a top side of said semiconductor power switching device.

* * * * *